United States Patent [19]

Krause

[11] Patent Number: 4,491,509
[45] Date of Patent: Jan. 1, 1985

[54] METHODS OF AND APPARATUS FOR SPUTTERING MATERIAL ONTO A SUBSTRATE

[75] Inventor: Dennis L. Krause, Atkinson, N.H.

[73] Assignee: AT&T Technologies, Inc., New York, N.Y.

[21] Appl. No.: 587,746

[22] Filed: Mar. 9, 1984

[51] Int. Cl.³ .......................................... C23C 15/00
[52] U.S. Cl. ............................... 204/192 R; 204/298
[58] Field of Search ........................... 204/298, 192 R

[56] References Cited

U.S. PATENT DOCUMENTS

| | | |
|---|---|---|
| 3,501,393 | 1/1970 | Wehner et al. ...................... 204/298 |
| 3,540,993 | 9/1966 | Wurm et al. ....................... 204/298 |
| 3,595,773 | 7/1971 | Wurm et al. ..................... 204/192 R |
| 3,619,402 | 11/1971 | Wurm et al. ....................... 204/298 |
| 3,632,494 | 1/1972 | Herte et al. ....................... 204/298 |
| 3,829,373 | 1/1973 | Kuehnle ............................. 204/298 |
| 3,856,654 | 12/1974 | George ............................... 204/298 |
| 3,976,555 | 8/1976 | von Hartel ......................... 204/298 |
| 4,128,466 | 12/1978 | Harding et al. .................... 204/298 |

FOREIGN PATENT DOCUMENTS

| | | | |
|---|---|---|---|
| 7720766 | 2/1979 | France ................................ 204/298 |
| 1419496 | 12/1975 | United Kingdom ................ 204/298 |

Primary Examiner—Arthur P. Demers
Attorney, Agent, or Firm—D. D. Bosben

[57] ABSTRACT

An argon-nitrogen sputtering gas mixture is introduced into a cylindrical sputtering chamber (20) at essentially the geometric center of the chamber. The gas mixture then disperses through open areas in the chamber about upper and lower edges of a cylindrical tantalum target (24) and homogeneously into a sputtering area (30) between the target and a plurality of substrates (12) on a rotatable carrousel (28). As tantalum material then is sputtered from the target onto the substrates (12), tantalum films (16), which are uniformly doped with nitrogen, are formed on the substrates. A target cooling cell assembly (26), comprising a pair of C-shaped cooling cells (92) having independent cooling water input-and-return systems (95), provides improved cooling of the target during the sputtering operation.

16 Claims, 5 Drawing Figures

Fig. 3

METHODS OF AND APPARATUS FOR SPUTTERING MATERIAL ONTO A SUBSTRATE

FIELD OF THE INVENTION

This invention relates to methods of and apparatus for sputtering material onto a substrate, and more particularly to improved and simplified methods of and apparatus for providing a uniformly-doped film of a material on a substrate as the material is being sputtered onto the substrate.

BACKGROUND OF THE INVENTION

A known process for fabricating a plurality of thin film devices on a ceramic substrate, wherein the thin film devices include alpha tantalum capacitors, involves the initial steps of selectively glazing the substrate in proposed capacitor areas, sputtering a tantalum film on the substrate, thermally oxidizing the tantalum film to form a tantalum pentoxide underlay, and then sputtering an alpha tantalum (nitrogen-doped) film over the underlay. The alpha tantalum film then is selectively etched to produce capacitor base electrodes, initial layers of associated contact pads, and a system of anodization bus bars. Portions of the capacitor base electrodes then are anodized to form capacitor dielectrics, upon which upper capacitor electrodes subsequently are formed by known deposition and etching techniques.

More specifically, a plurality of the thin film circuit devices are formed on a substrate simultaneously and the substrate subsequently is separated along preselected lines to produce the individual thin film circuit devices. Further, the sputtering of the underlay and the alpha tantalum films on the substrate generally is accomplished in a sputtering chamber simultaneously with other substrates also disposed in the sputtering chamber.

One sputtering system which has been used for this purpose includes a cylindrical sputtering chamber having a rotatable carrousel for conveying substrate holders, each having a pair of the substrates mounted therein, around a circular target cathode of the tantalum material to be sputtered onto the substrates. In this apparatus, the circular target was fixedly mounted in the cylindrical sputtering chamber in encircling relationship to an annular-shaped combination gas distribution-target cooling cell. The gas distribution-target cooling cell was of split, essentially annular construction to permit the cell to be expanded radially outward and clamped against an interior surface of the target. More specifically, the gas distribution-target cooling cell was constructed with a system of interior passageways for carrying cooling water continuously through the cooling cell for target cooling purposes. The cooling cell also included a system of interior passageways for carrying a sputtering gas, consisting of a mixture of argon gas and a nitrogen doping gas, through the cell to an array of gas exit openings in an outer wall of the cooling cell. The gas exit openings in the outer wall of the cooling cell were aligned with respective small (1/32") apertures which had been drilled through the target, to permit the argon-nitrogen sputtering gas mixture to feed through the target into a sputtering area in the sputtering chamber between the target and the carrousel upon which the substrates were mounted. Gas diffuser devices also have been mounted in the drilled apertures, to spread the gas mixture emanating from the apertures over an outer surface of the target.

In the sputtering of the alpha tantalum film on the substrate as above described, in order for the film to be of acceptable quality for use in fabricating thin film capacitors, it is essential that the amount of interstitial contamination within the film be kept within certain preselected limits. It also is necessary that the nitrogen content in the alpha tantalum film be such that the film has a temperature coefficient of resistance (TCR) within a preselected range. Further, for satisfactory results the nitrogen content of the alpha tantalum film must be uniform throughout the film within preselected limits. In the prior known sputtering system discussed above, this required that upper and lower outer peripheral edges of the combination gas distribution-target cooling cell be fitted within the cylindrical target in tight-fitting sealed relationship with upper and lower interior peripheral edges of the target, to preclude leakage of the sputtering gas mixture from between the cell and the target upper and lower edges so as to produce areas in certain portions of the substrates which were excessively rich in nitrogen.

The attaining of adequate leak-proof seals between the upper and lower peripheral edges of the target and the combination gas distribution-target cooling cell, however, was difficult for various reasons. For example, it is difficult to fabricate the cylindrical target in the form of a true cylinder; rather, the target frequently is slightly out-of-round or has a slightly frusto-conical construction. Thus, the gas distribution-target cooling cell frequently could not be expanded into tight-fitting sealed engagement with the target. Further, since the target and the gas distribution-cathode cooling cell were assembled together within the sputtering chamber from the top thereof, access to the lower edges of the target and the cooling cell to determine whether they were in tight-fitting relationship was extremely difficult.

Accordingly, in preparing for an alpha tantalum sputtering operation the tantalum target initially was "cleaned up" by checking for vacuum leaks, pumping the sputtering chamber down to a high vacuum, and then initiating "bakeout" of the system. More specifically, tantalum was initially sputtered onto "clean-up" substrates for several hours at a high power level without nitrogen doping, to sputter-clean the target surface, and to heat the sputtering chamber walls and chamber interior fixturing so as to "out gas" any residual gas or organic contamination, which was then pumped away. The freshly deposited tantalum on the chamber interior surfaces and fixturing, and on the "clean-up" substrates, also facilitated "cleaning up" by causing "gettering" of any residual gases such as nitrogen or oxygen.

After the system was ready for production from a "clean" standpoint, the argon/nitrogen sputtering gas mixture was introduced into the system at a normal operating rate through the combination distribution gas-target cooling cell and the apertures in the target, to check for leaks between the upper and lower edges of the cell and the target which would produce nitrogen-rich alpha tantalum film having unacceptable TCR values. Since the sputtering system was in a closed "clean" operating condition, this was accomplished by sputtering tantalum for a preselected time period (several minutes) onto sets of sample substrates mounted in holders in respective spaced stationary positions about the interior of the sputtering chamber, such as four positions on the order of 90° apart, preferably in independent separate sputtering operations. For example, a first one of the substrate holders was loaded into a position on the sputtering chamber carrousel, indexed into a respective one of the spaced positions in the sputtering chamber, and then subjected to sputtering for the preselected time period while in a stationary condition. After being sputtered, the first set of sample substrates was unloaded from the carrousel and the next set of sample substrates was loaded into the carrousel and sputtered in the same manner in its respective position in the sputtering chamber. After all of the sets of sample substrates had been sputtered in this manner, the TCR of the substrates in each holder was measured. A range in the TCR measurements in excess of a preselected value indicated that an unacceptable gas leak condition existed between one or both of the upper and lower edges of the gas distribution-target cooling cell and the target, and that the system would probably not produce acceptable parts. It then was necessary to shut the system down, open the sputtering chamber, and remount the target to the gas distribution-target cooling cell. The sputtering chamber then was re-closed and the above described "clean-up" and gas-leak detection operations were repeated, with a significant loss in production time and in the sputtering life of the target.

In addition to producing alpha tantalum films with nonuniform nitrogen doping as above described, the inability to mount the essentially annular combination gas distribution-target cooling cell in firm mating engagement with the interior of the target reduced the effectivenss of the cell in cooling the target during a sputtering operation. Further, since a large part of the cell was occupied by internal gas passageways, the space available within the cell for cooling water channels was reduced, thus limiting the target cooling capacity of the cell. As a result, the target tended to overheat during the sputtering operation, particularly if sputtering was carried out at too rapid a rate, thus limiting the production output of the apparatus. The pre-drilling of the gas feed apertures in the target, and the mounting of the gas diffusers in the openings, also was time consuming and reduced the amount of target material available for sputtering.

Accordingly, a purpose of this invention is to provide a new and improved simplified system for sputtering a film of uniformly doped material onto a substrate wherein the system also produces more efficient cooling of a target material being sputtered so as to enable production by the system to be increased.

SUMMARY OF THE INVENTION

In general, a method of sputtering material onto a substrate comprises disposing a target of the sputtering material in a sputtering chamber such that a first surface of the target faces a first portion of the sputtering chamber and a second opposite surface of the target faces a second portion of the sputtering chamber. The substrate is disposed in the second portion of the sputtering chamber in opposed relationship to the target to define a sputtering area in the sputtering chamber between the substrate and the target. A sputtering gas mixture, which includes a doping gas, is introduced into the first portion of the sputtering chamber at a point which is in opposed relationship to the first surface of the target. The sputtering gas mixture then is diffused about opposite edges of the target and homogeneously into the sputtering area in the second portion of the sputtering chamber between the substrate and the second surface of the target during a sputtering operation, while precluding flow of the sputtering gas mixture through the target into the sputtering area.

More specifically, the sputtering chamber and the target both are of cylindrical essentially concentric construction and the sputtering gas mixture is introduced into the sputtering chamber at a point adjacent the geometric centers of the sputtering chamber and the target. The sputtering gas mixture also is introduced into the sputtering chamber in a direction extending essentially along central axes of the sputtering chamber and the target. The sputtering gas mixture then is diffused about upper and lower peripheral edges of the cylindrical target into an essentially annular sputtering area defined by the cylindrical target and a plurality of substrates which have been disposed in the sputtering chamber about the cylindrical target, for sputtering the target material onto substrates simultaneously. During the sputtering operation, the cylindrical target is cooled by a pair of C-shaped cooling cells which have been expanded radially outward into firm engagement therewith and which have independent cooling medium input lines for connecting the cooling cells to a cooling medium source.

DETAILED DESCRIPTION

Figures 1, 2:
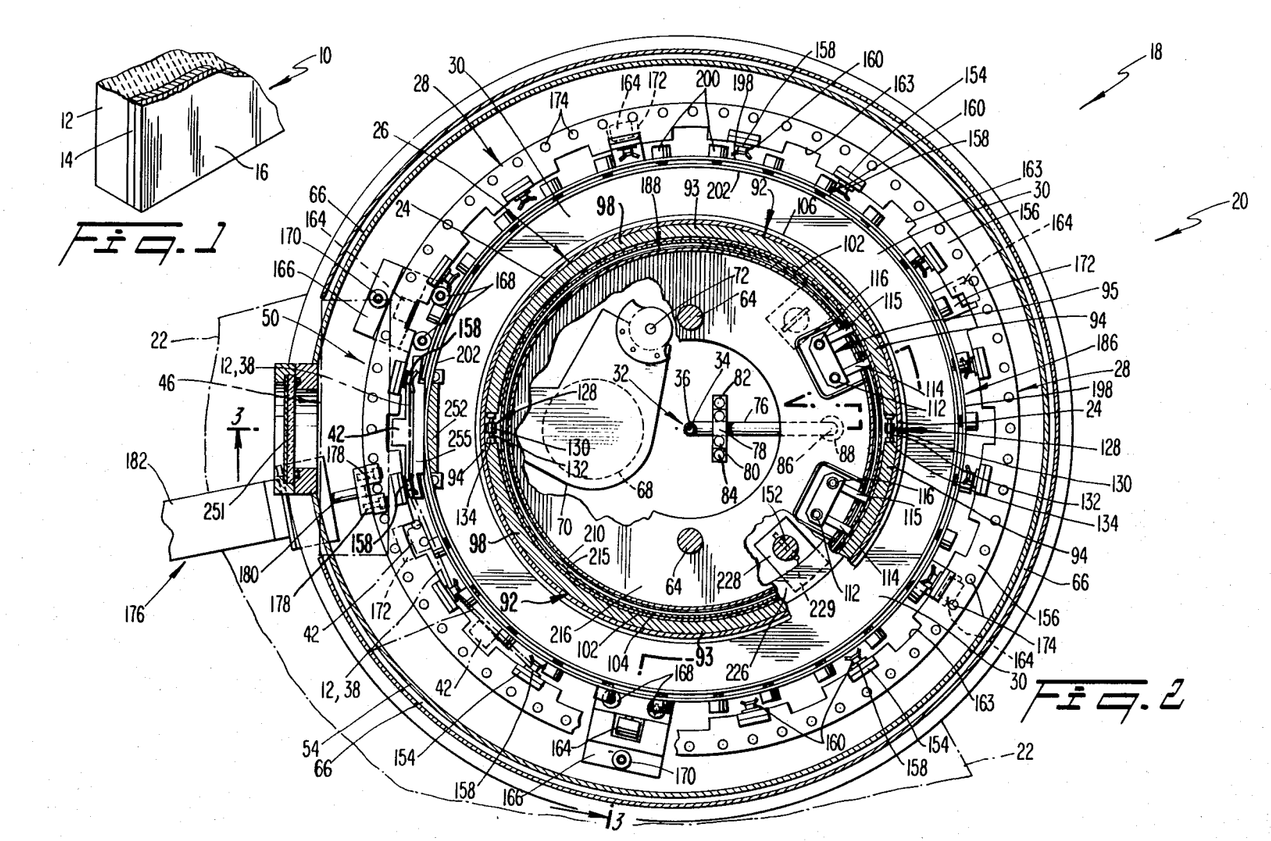
FIG. 1 is a partial isometric view of an article which may be fabricated utilizing the invention.
FIG. 2 is a plan cross-sectional view of apparatus in accordance with the invention, taken along the line 2—2 in FIG. 3.

Referring to FIG. 1, an article 10 which may be formed utilizing the subject invention comprises a planar substrate 12 of a suitable electrically insulating material, such as ceramic, for producing a plurality of thin film devices (not shown) in the form of, or comprising, thin film alpha tantalum capacitors (not shown). The substrate 12, as shown in FIG. 1, has been selectively glazed in proposed capacitor areas and a thin underlay film 14 of tantalum pentoxide has been formed on the substrate by prior sputtering and thermal oxidizing operations. A thin tantalum film 16 then is sputtered on the underlay film 14 utilizing the subject invention, such that the tantalum film is uniformly doped with a gaseous doping agent in the form of nitrogen to on the order of 14–20%, to form what is known in the art as alpha tantalum. The substrate 12, including the alpha tantalum film 16, then may be subjected to additional processing in a known manner, to produce the above-mentioned thin film devices.

Figure 3:
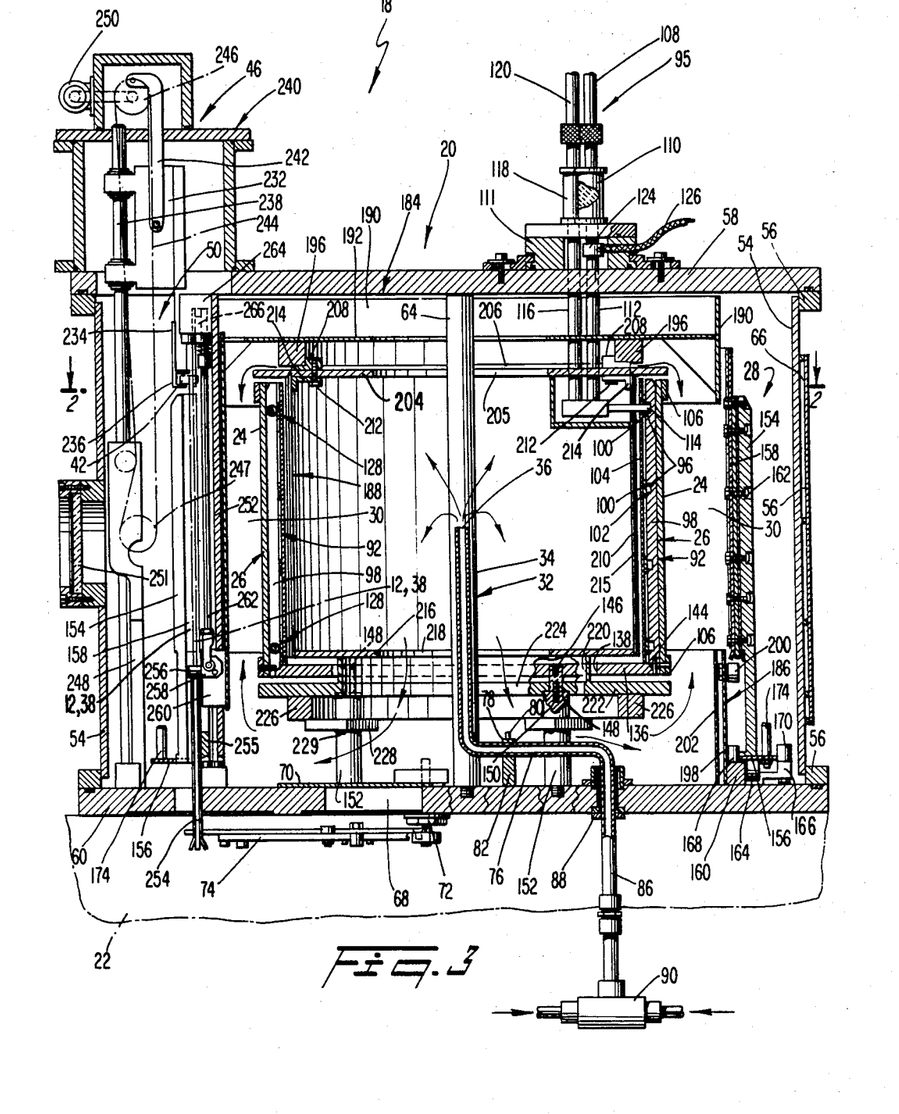
FIG. 3 is an elevational cross-sectional view, taken along the line 3—3 in FIG. 1.

In general, referring to FIGS. 2 and 3, a sputtering apparatus 18 in accordance with the invention may be of a cylindrical, continuous vacuum type as disclosed in the C. H. George U.S. Pat. No. 3,856,654, issued Dec. 24, 1974 and entitled "Apparatus for Feeding and Coating Masses of Workpieces in a Controlled Atmosphere," the disclosure of which, to the extent not inconsistent with this disclosure, is hereby incorporated by reference. In this regard, the apparatus 18 comprises a hollow cylindrical sputtering chamber 20 suitably supported above a lower vacuum chamber housing 22 (illustrated by phantom lines). A hollow cylindrical solid tantalum target 24 is fixedly supported in the sputtering chamber 20 on a cooling cell assembly 26 with an inner surface of the target facing toward a central interior portion of the sputtering chamber and an outer surface of the target facing toward an outer portion of the sputtering chamber. A rotatable circular carrousel or cage 28, for supporting substrates 12 upon which the alpha tantalum films 16 (FIG. 1) are to be sputtered, and for rotating the substrates about the hollow cylindrical tantalum target 24, is mounted in the sputtering chamber 20 such that the substrates and the target define an outer essentially annular sputtering area 30 therebetween in the outer portion of the sputtering chamber. The sputtering of tantalum material onto the substrates 12 is carried out under vacuum in an operation in which the target 24 is maintained at a high voltage in an inert atmosphere, such as a mixture of an argon sputtering gas and the nitrogen gas doping agent, and in which the argon becomes ionized to cause sputtering of the tantalum material from the target across the essentially annular sputtering area 30 onto the substrates.

In general, as is best shown in FIG. 3, in accordance with this invention the argon-nitrogen gas mixture is introduced directly into the central interior portion of the cylindrical sputtering chamber 20 through a tube 32 having a vertical portion 34 which extends along aligned vertical central axes of the cylindrical target 24 and the carrousel 28, and thus essentially along an adjacent slightly offset (to the left in FIGS. 2 and 3) vertical central axis of the cylindrical sputtering chamber. The tube 32 terminates in a discharge orifice 36 located at geometric centers of the cylindrical target 24 and the carrousel 28, and thus closely adjacent a geometric center of the sputtering chamber 20. As is illustrated by arrows in FIG. 3, the gas mixture then diffuses through open areas in the cylindrical sputtering chamber 20 above and below upper and lower edges of the target 24, respectively, and diffuses homogeneously into the essentially annular sputtering area 30. As a result, the nitrogen doping gas becomes incorporated into the tantalum being sputtered from the target 24 onto the substrates 12 to produce more uniformly doped alpha tantalum films 16 (FIG. 1) than have been achieved with prior known systems. The introduction of the argon-nitrogen gas mixture directly into the cylindrical sputtering chamber 20 adjacent its geometric center, rather than through passageways in a cooling cell and apertures in the target, as in prior known cylindrical sputtering systems, also permits the cooling capacity of the cooling cell 26 to be significantly increased in comparison to prior known target cooling systems. Accordingly, the sputtering rate of the target 24 can be significantly increased without overheating, resulting in increased production in comparison to prior known systems.

More specifically, in a sputtering operation a pair of the planar substrates 12 are mounted in a suitable rectangular frame-type holder or "tray" 38, illustrated in broken lines in FIGS. 2 and 3. An upper cross member of each substrate holder 38 includes a projecting lift flange 42 (best shown at the left-hand side of FIG. 3) for use in loading the substrate holder 38 into the sputtering chamber 20 and unloading the holder from the sputtering chamber, by an elevator mechanism 46 (shown only in FIG. 3).

The sputtering chamber 20 is suitably supported on the lower vacuum chamber housing 22 with a substrate holder load-unload position 50 (left-hand side of FIGS. 2 and 3) of the carrousel 28 in the sputtering chamber aligned with a substrate holder transfer position of the lower vacuum chamber. Thus, substrate holders 38, having substrates 12 to be sputtered therein, are sequentially transferred from a magazine (not shown) in the lower vacuum chamber housing 22 upward into the carrousel 28 by the elevator mechanism 46 as the carrousel is rotatably indexed during a sputtering operation, to fill the carrousel with substrate holders and substrates. Further, once the carrousel 28 has become filled with substrate holders 38 such that a first-transferred substrate holder has been indexed around the sputtering chamber 20 back to the carrousel load-unload position 50, the substrate holders also are transferred from the carrousel by the elevator mechanism 46 back into the magazine (not shown) in the lower vacuum chamber housing 22 for subsequent removal from the apparatus 18.

The cylindrical sputtering chamber 20 includes a cylindrical wall member 54 having annular mounting rings 56 (FIG. 3) welded thereto about the upper and lower ends thereof. A horizontal cover plate 58 (FIG. 3) and a horizontal base plate 60 are suitably secured to the annular mounting rings 56, with annular seals between the plates and the mounting rings, such as by screw-threaded mounting stud-and-nut assemblies (not shown). A pair of spaced support posts 64 (only one shown in FIG. 3) extend vertically between the cover plate 58 and the base plate 60, and have lower ends screw-threadedly mounted in the base plate. A major portion of the cylindrical wall member 54 is surrounded by a cooling chamber 66 through which cooling water is circulated in a suitable manner (not shown) during a sputtering operation to aid in the dissipation of heat. Vacuum is provided in the sputtering chamber 20 from the lower vacuum chamber housing 22 through a vacuum port 68 in the base plate 60 of the sputtering chamber. The vacuum in the sputtering chamber 20 is controlled by a shutter plate 70 pivotally mounted on the base plate 60 for movement between open and closed positions with respect to the vacuum port 68. More specifically, the shutter plate 70 is fixed to a pivot assembly 72 journaled in and extending through the base plate 60, and having a manually operated lever mechanism 74 (FIG. 3) secured thereto on the underside of the base plate.

The vertical portion 34 of the gas mixture introducing tube 32 merges into a horizontal portion 76 of the tube which is secured by a clamp member 78 and screws 80 to a support block 82. The support block 82 is secured to the sputtering chamber base plate 60 by screws 84 (FIG. 2). The horizontal portion 76 of the tube 32 merges into a second vertical tube portion 86 which extends through a suitable seal assembly 88 in the base plate 60 to a gas mixing valve 90 (FIG. 3).

As a result of the introduction of the argon-nitrogen gas mixture into the sputtering chamber 20 adjacent the geometric center of the chamber through the tube 32 in accordance with this invention, a unitary combination gas distribution-target cooling cell with a system of continuous gas mixture-carrying passageways and a system of cooling water channels, as has been the case in prior cylindrical target cooling systems, is not required in the sputtering chamber. Accordingly, to improve cooling of the target 24 during a sputtering operation, and thereby permit the sputtering rate of the target and production by the sputtering apparatus 18 to be increased, an additional aspect of this invention involves making the cooling cell assembly 26 of a dual-cell construction, with the cooling cell assembly comprising a pair of C-shaped cooling cells 92. The C-shaped cooling cells 92 initially are fabricated with a radius which is slightly smaller than a radius of the cylindrical target 24, to facilitate initial seating of midportions 93 (FIG. 2) of the cells firmly against the target, and to facilitate subsequent expansion of end portions 94 (FIG. 2) of the cells radially outward into tight-mating engagement with the interior surface of the target, thereby enhancing heat transfer from the target to the cooling cells during a sputtering operation. The C-shaped cooling cells 92 also are provided with independent cooling water input and return line systems 95, thereby doubling the cooling capacity of the cooling cell assembly 26 over prior known target cooling systems. Further, elimination of the gas mixture passageways also enables the cooling capacity of each cooling cell 92 to be increased by increasing the internal volume of the cell occupied by an elongated continuous cooling water passageway 96 (FIG. 3) formed therein.

Each of the cooling cells 92 includes a C-shaped plate member 98, of a material such as stainless steel or aluminum, having a continuous channel 100 (FIG. 3) formed therein in a desired pattern to form three sides of the cooling water-carrying passageway 96 of the cooling cell. Elongated aluminum strips 102, of a material such as aluminum, are welded to the plate 98 over the channel 100 to complete the passageway 96. Each cooling cell 92 may be fabricated in a known manner by forming the channel 100 in the plate with the plate in a flat condition, forming the plate into a C-shaped configuration, and then welding the aluminum strips 102 to the plate. A protective smooth cylindrical inner lining 104, of a material such as stainless steel, is positioned adjacent the aluminum strips 102 of the cooling cells 92 (which are at a high voltage during a sputtering operation) to preclude a plasma buildup adjacent the aluminum strips and sputtering of the strips during the sputtering operation. The tantalum target 24 also includes upper and lower tantalum electron control bands 106 (FIG. 3) which encircle upper and lower target edge portions, respectively, and which are secured to the target by suitable dowels for confining electrons between the upper and lower target edge portions during a sputtering operation.

Each cooling water input and return line system 95 includes an outer input tube 108 (FIG. 3) extending from a suitable cooling water source (not shown) into a ceramic electrical insulator tube 110 (FIG. 3) suitably mounted (e.g., bonded) on top of a small housing assembly 111 secured to the cover plate 58 of the cylindrical sputtering chamber 20. An inner vertical input tube 112 extends from a lower end of the ceramic insulator tube 110 through the cover plate 58 in spaced and electrically-insulated relationship to the cover plate, and communicates with a horizontal input tube 114 welded to the adjacent cooling cell 92 in communication with an input end of the cooling water-carrying passageway 96 in the cooling cell. Similarly, cooling water is returned from the cooling cell 92 to the cooling water source for re-cooling through a horizontal return line 115 (FIG. 2) welded to the cooling cell at an exit end of the water-carrying passageway 96 in the cooling cell, an inner vertical return line 116, a ceramic electrical insulator tube 118 (FIG. 3) and an outer vertical return line 120 (FIG. 3). Protective ceramic insulator tubes (not shown) also may surround portions of the inner input and return lines 112 and 116, respectively. High voltage is applied to the cooling cell assembly 26 during the sputtering operation, and thus to the target 24, by attaching an electrical clip or clamp 124 (FIG. 3) on a high voltage cable 126 to an upper portion of one of the inner vertical cooling water tubes 112 or 116 in the small housing assembly 111.

As is best shown in FIG. 2, the C-shaped cooling cells 92 are held in outwardly-expanded mating engagement with the interior surface of the target 24 by expandable wedging assemblies 128 disposed between opposed edges of the cooling cells at, and between if so desired, upper and lower ends thereof. Each wedging assembly 128 may be of a known "turnbuckle" type which includes a central screw-threaded nut member 130 and screw-threadably mounted studs 132 of opposite-hand extending from the nut member. A metal pressure pad 134 is screw-threadably mounted on each stud member 132 and engages a respective one of the opposed edges of the cooling cells 92. Thus, rotation of the nut member 130 in one direction or the other causes the pressure pads 134 to move into and out of engagement, respectively, with the opposed edges of the cooling cells 92. The construction of the cooling assembly 26 is such that the target 24 and the cooling cells 92 can be assembled outside of the sputtering chamber 20 so that the assembled target and cells can be inspected visually to help insure tight-fitting mating engagement therebetween. In this regard, the C-shaped cooling cells 92 initially are expanded into mating engagement with the target 24 by suitable jacking devices (not shown), whereupon the wedging assemblies 128 are inserted between and tightened against the opposed edges of the cooling cells to retain the cells in their expanded positions when the jacking devices are removed. The resultant assembly of the target 24, cooling cells 92 and wedging assemblies 128 then may be mounted in the cylindrical sputtering chamber 20.

Referring to FIG. 3, the target cooling cell assembly 26 is suitably supported in the cylindrical sputtering chamber 20 on an annular support plate 136 having a central opening 138 therein. For example, a lower end of each cooling cell 92 may have an outwardly beveled inner edge surface and a horizontal lower end bottom surface resting on respective mating outer edge surfaces of the support plate 136, with upwardly projecting aligning dowels 144 (one shown at right-hand side of FIG. 3) fixedly mounted in the support plate and extending into alinging apertures in the cooling cell with a working fit. The annular support plate 136 is secured by screws 146 (one shown in FIG. 3) to upper ends of four small electrical insulator pins 148 of a material such as ceramic, located at circumferentially spaced 90° intervals in the sputtering chamber 20. Lower ends of the insulator pins 148 are fixedly mounted, by screw-threaded studs 150, on upper ends of four similarly spaced vertical support shafts 152. Lower ends of the support shafts 152 are screw-threadably mounted in the base plate 60 of the sputtering chamber 20.

The rotatable carrousel 28 comprises a series of upstanding circumferentially-spaced support posts 154 fixedly secured at lower ends thereof, such as by welding, on an annular horizontal indexing ring 156. Each support post 154 has a suitable guideway assembly 158, such as inner and outer plates separated by an intermediate plate of reduced width, to define substrate holder edge-receiving guideways 160 (best shown in FIG. 2), secured to the post by screw-and-nut assemblies 162 (FIG. 3). The annular indexing ring 156 includes a series of slots 163 (FIG. 2) formed along an inner edge thereof for passage of the lift flanges 42 on the substrate holders 38 during substrate holder loading and unloading operations.

The annular indexing ring 156 rides on a series of support rollers 164 suitably mounted in circumferentially spaced relationship. For example, with reference to the bottom of FIG. 2 and the right-hand side of FIG. 3, one of the support rollers 164 is shown as being mounted in a recess in a respective one of two essentially U-shaped support block assemblies 166 suitably secured to the sputtering chamber base plate 60. A pair of inner rollers 168 (only one shown in FIG. 3) and an outer roller 170 are mounted on top of respective upstanding legs of the support block assembly 166, and engage inner and outer edges, respectively, of the annular indexing ring 156, to preclude radial movement of the carrousel 28. Additional ones of the support rollers 164 may be supported on respective support brackets 172 (FIG. 2) secured to the base plate 60.

A series of vertically extending, circumferentially-spaced indexing pins 174 are mounted on the indexing ring 156 for sequential engagement by an indexing mechanism 176 (left-hand side of FIG. 2) during a sputtering operation. The carrousel indexing mechanism 176, which may be of any suitable type, includes a pair of spaced drive rollers 178 rotatably mounted on opposite ends of a cross member on one end of a horizontal shaft 180. The drive rollers 178 alternately engage between successive ones of the indexing pins 174 as the shaft 180 is rotated intermittently by a drive motor 182 mounted in the cylindrical wall member 54 of the sputtering chamber 20.

During a sputtering operation, extraneous deposit of sputtered material on various internal parts of the sputtering chamber 20 is reduced by upper and lower shield assemblies 184 (FIG. 3) and 186, respectively, and an interior shield assembly 188. Referring to FIG. 3, the upper shield assembly 184 includes a cylindrical outer member 190 and a horizontal inner annular plate member 192 having a central opening therein. The cylindrical outer member 190 and the annular plate member 192 are secured together, such as by welding. In a sputtering operation the inner annular plate member 192 of the upper shield assembly 184 rests on an upper magnetic field shaping ring 196 (FIG. 3) of ferromagnetic material.

The lower shield assembly 186 includes an outer split, essentially cylindrical member 198 which is positioned on the sputtering chamber base plate 60 inside the carrousel support block assemblies 166 and support brackets 172 (FIG. 2). A series of circumferentially spaced rollers 200 are mounted about an upper portion of the outer cylindrical member 198 for supporting the substrate holders 38 in the guideway assemblies 158 of the carrousel 28. A second inner cylindrical member 202 is positioned on the sputtering chamber base plate 60 closely adjacent the outer cylindrical member 198.

Referring to FIG. 3, the interior shield assembly 188 includes an upper annular shield plate 204 having a central opening 205 therein. The upper magnetic field shaping ring 196 is supported on the upper annular shield plate 204 in spaced relationship to the plate to define a series of circumferentially extending passageways 206 therebetween, through which the gas mixture from the tube 32 flows to the annular sputtering area 30 during a sputtering operation. More specifically, the upper magnetic field shaping ring 196 is supported on four support members 208 (only two shown in FIG. 3) located at 90° intervals circumferentially about the upper annular shield plate 204. Each support member 208 is secured to the upper annular shield plate 204, and the upper annular shield plate is secured to a top of an internal shield cylinder 210, by a screw 212 extending through a bracket 214 welded to the cylinder. A removable cylindrical outer liner 215, of a material such as stainless steel, surrounds the shield cylinder 210.

A lower end of the shield cylinder 210 is welded to a lower annular shield plate 216 having a central opening 218 therein. The lower annular shield plate 216 rests on an upper end of a cylindrical support ring 220, which rests at a lower end on an annular support table 222 having a central opening 224 therein. A lower magnetic field shaping ring 226 of ferromagnetic material is supported beneath the annular support table 222 on four rectangular support plates 228. The rectangular support plates 228 have openings therein such that each support plate can be positioned over a respective one of the support posts 152 with each support plate being supported on the post by projecting opposite ends of a dowel 229 extending through the post.

As is best shown in FIG. 3, during a sputtering operation the argon-nitrogen gas mixture is introduced into the interior of the cylindrical sputtering chamber 20 through the tube 32 and exits from the discharge orifice 36 of the tube essentially at the geometric centers of the sputtering chamber 20, the target 24 and the carrousel 28, as noted hereinabove. As the sputtering gas mixture fills the interior of the interior shield assembly 188, the gas mixture initially flows vertically upward through the central opening 205 in the upper annular shield plate 204 of the assembly and then flows radially outward in all directions through the pasageways 206 between the shield plate and the upper magnetic field shaping ring 196. The gas mixture then is diverted downward by the cylindrical outer member 190 of the upper shield assembly 184, into the annular sputtering area 30 between the target 24 and the substrates 12 on the carrousel 28.

Figure 4:
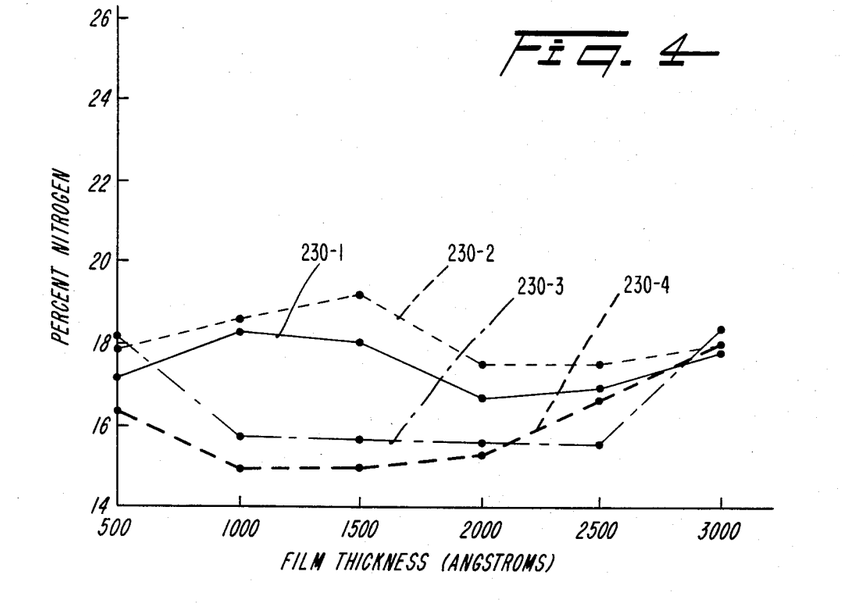
FIG. 4 is a chart illustrating nitrogen dopant concentrations in various levels of films which were sputtered utilizing this invention.
Figure 5:
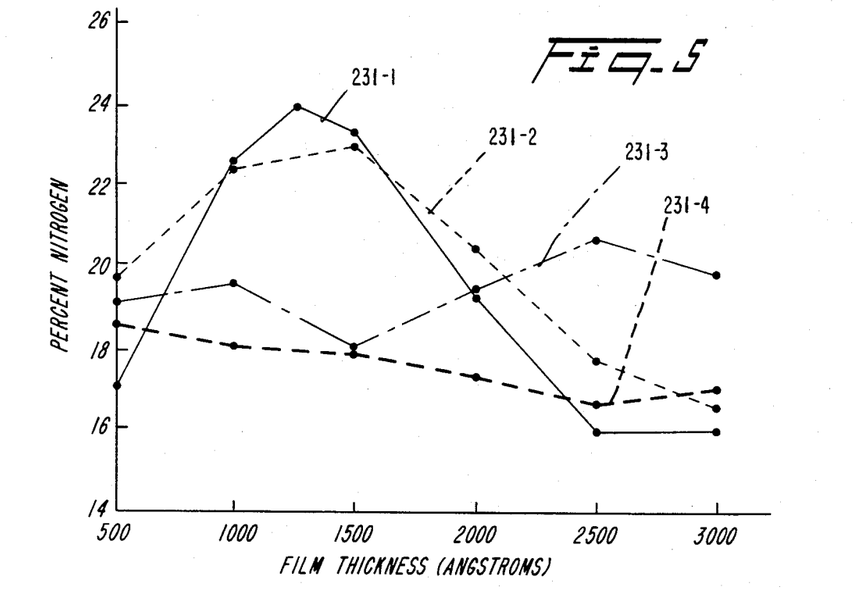
FIG. 5 is a chart illustrating nitrogen dopant concentrations in various levels of films sputtered utilizing a prior known system.

At the same time, the gas mixture emanating from the discharge orifice 36 of the tube 32 flows downward through the central opening 218 in the lower annular shield plate 216 of the interior shield assembly 188, the cylindrical support ring 220, the central opening 224 in the support table 222, and the lower magnetic field shaping ring 226. Next, the gas mixture disperses radially in all directions between the lower magnetic field shaping ring 226 and the sputtering chamber base plate 60, and is diverted upward into the sputtering area 30 by the inner cylindrical shield member 202 of the lower shield assembly 186. Thus, the gas mixture becomes homogenously dispersed throughout the sputtering area 30 from above and below the tantalum target 24, whereby the sputtered tantalum films 16 (FIG. 1) on the substrates 12 are more uniformly doped with nitrogen in comparison to films formed utilizing prior known doping systems in which nitrogen gas feeds through apertures in the target, as is illustrated in FIGS. 4 and 5. At the same time, the C-shaped cooling cells 92 provide improved cooling of the target 24 in comparison to that attainable with prior known cooling systems, to enable sputtering to be carried out at an increased rate and with a higher production output than that attainable with prior known sputtering systems.

FIG. 4 discloses nitrogen dopant concentrations measured at various levels in tantalum films 16 (FIG. 1) which had been sputtered on a first pair of the substrates 12 (FIG. 1) while introducing nitrogen gas into the sputtering chamber 20 adjacent the geometric center thereof in accordance with this invention. Similarly, FIG. 5 discloses nitrogen dopant concentrations measured at various levels in tantalum films 16 which had been sputtered on a second pair of the substrates 12 while introducing nitrogen gas into the sputtering chamber 20 through apertures in a target being sputtered, in accordance with a known through-target doping system. In this regard, each pair of the substrates 12 was selected at random from a respective group of substrates upon which tantalum films 16 had been sputtered in a sputtering operation to a thickness of 3,000 Angstroms. Further, in each sputtering operation, each pair of the substrates 12 was mounted in one of the substrate holders 38, one above the other in upper and lower relationship, in a usual manner. In each instance, the sputtering parameters were identical, except for the manner in which the nitrogen gas was introduced into the sputtering chamber 20.

Samples of the sputtered films 16 then were removed adjacent the top and middle of each of the selected upper substrates 12, and adjacent the middle and bottom of each of the selected lower substrates 12, at successive depths, and the concentration of nitrogen in each sample was measured. In FIG. 4, the measured concentrations of nitrogen adjacent the top and middle of the first upper substrate 12, and adjacent the middle and bottom of the first lower substrate 12, are represented by the curves 230-1, 230-2, 230-3 and 230-4, respectively. Similarly, in FIG. 5, the measured concentrations of nitrogen adjacent corresponding points on the second substrates 12 are represented by the curves 231-1, 231-2, 231-3 and 231-4, respectively.

It is seen that in the films 16 sputtered utilizing nitrogen doping in accordance with this invention (FIG. 4) the nitrogen concentrations were more uniform in nature. More specifically, utilizing the subject invention the nitrogen concentrations varied from on the order of slightly below 15% at a film thickness of 1,000 Angstroms adjacent the bottom of the first lower substrate 12, to on the order of slightly above 19% at a film thickness of 1,500 Angstroms at the middle of the first upper substrate 12, for a range on the order of slightly over 4%. In contrast, utilizing the prior known through-target nitrogen doping system (FIG. 5), the nitrogen concentrations varied from on the order of 16% at film thicknesses of 2,500 and 3,000 Angstroms adjacent the top of the second upper substrate 12, to an excessively high value on the order of 24% (indicative of a gas leak in the system) at a film thickness of 1,250 Angstroms adjacent the top of the second upper substrate, for a range on the order of 8%, or almost double the range achieved with the subject invention.

Referring to the left-hand side of FIG. 3, the elevator mechanism 46, which may be of any suitable type, includes a vertical slide 232 having a vertically depending arm 234 provided with a lift hook 236 at a lower end thereof. The slide 232 is supported for vertical movement on a pair of horizontally spaced vertical support rods 238 (only one shown). Lower ends of the support rods 238 are fixedly mounted on the base plate 60 of the sputtering chamber 20 and upper ends of the support rods are fixedly mounted in a horizontal upper plate member of an upper elevator housing assembly 240 mounted on the top plate 58 of the sputtering chamber.

The vertical slide 232 is secured by a pair of pivoted links 242 (only one shown in FIG. 3) on opposite sides thereof to a pair of lift chains 244 extending about upper drive sprockets 246 mounted for rotation in the upper housing assembly 240, and about lower idler sprockets 247 mounted for rotation on a pair of vertical support posts 248 (only one shown in FIG. 3) fixedly mounted at their lower ends on the base plate 60 of the sputtering chamber 20. The upper sprockets 246 are reversibly driven by a small reversible motor 250 mounted on the upper housing assembly 240. A viewport 251 is mounted in the sputtering chamber cylindrical sidewall member 54 for observing the elevator mechanism 46 during the sputtering operation. A vertical shield plate 252 (also shown in FIG. 2) is suitably mounted between the cover plate 58 and the base plate 60 of the sputtering chamber 20 opposite the elevator mechanism 46 to separate the elevator mechanism from the sputtering area 30.

In operation of the elevator mechanism 46, when the vertical slide 232 is in its lower position, the lift hook 236 on the slide is disposed in the lower vacuum chamber housing 22. As the substrate holders 38 in the lower vacuum chamber housing 22 then are indexed in the usual manner, the lift flange 42 on one of the holders is indexed into the lift hook 236 on the vertical slide 232. The elevator motor 250 then is energized counterclockwise in FIG. 3 to raise the elevator slide 232 and the substrate holder 38 engaged thereby, vertically into a pair of opposed guideways 254 (only one shown) which are suitably secured to a support plate 255 (also shown in FIG. 2) mounted on the sputtering chamber base plate 60, and which guide the substrate holder into opposed ones of the guideways 160 (FIG. 2) defined by a pair of adjacent ones of the carrousel guideway assemblies 158.

As the vertical slide 232 raises the substrate holder 38 into the spaced guideway assemblies 158 of the carrousel 28, a pair of support rollers 256 (one shown in FIG. 3) are pivoted into a position beneath the substrate holder as shown in FIG. 3. The rollers 256 are mounted on support brackets 258 (one shown in FIG. 3) pivoted on opposite sides of a block member 260 suitably secured in an opening in the vertical shield plate 252. The brackets 258 are pivotably connected to respective spring-biased vertical rods 262 (one shown in FIG. 3) each having an upper end slidably mounted in a support block 264 secured to the bottom of the sputtering chamber top plate 58. An upper end portion of each rod in the support block 264 is fixedly connected to a vertical actuating plate 266 depending from the support block. When an upper end of the substrate holder 38 engages the actuating plate 266 in a substrate holder loading operation, the spring-biased rods 262 are raised to pivot the rollers 256 from lower positions to upper positions beneath the substrate holder as shown in FIG. 3.

As the carrousel 28 indexes the substrate holder 38 out of the carrousel loading-unloading position 50, the lower end of the substrate holder rides onto adjacent ones of the support rollers 200 of the lower shield assembly 186. As a result, the substrate holder 38 eventually rides off the support rollers 256 in the loading-unloading position 50 and disengages from the actuating plate 266. At the same time, after the carrousel 28 has become filled with the substrate holders 38, one of the substrate holders which has sputtered substrates 12 therein also is indexed into the load-unload position 50 such that the lift flange 42 of this substrate holder moves into the lift hook 236 on the elevator slide 232 and benath the actuating plate 266. When the elevator motor 248 then is operated in a clockwise direction, as viewed in FIG. 3, the lift hook 236 lowers the substrate holder 38 into the magazine (not shown) in the lower chamber housing 22 and the spring-biased rods 262 return the pivotally mounted support rollers 256 to their lower positions. The load-unload operation then is repeated for the next substrate holders 38 in the lower chamber housing 22 and the sputtering chamber 20, respectively.

In summary, new and improved simplified methods of and apparatus for sputtering a uniformly doped film on a substrate, such as the nitrogen-doped tantalum film 16 on the substrate 12, have been disclosed. In this regard, the introducing of the argon-nitrogen sputtering gas mixture into the sputtering chamber 20 through the tube 32 adjacent the geometric center of the sputtering chamber such that the gas mixture then disperses through open areas in the sputtering chamber above and below the target 24 and homogeneously into the sputtering area 30, produces more uniformly doped tantalum films 16 than have been achieved with prior known sputtering systems. Further, since the target cooling cell assembly 26 does not carry the gas mixture to apertures in the target 24 as in prior known systems, the need for a time-consuming test for gas leaks between upper and lower edge portions of the target and the cooling cell assembly is not required. Further, the necessity for opening the sputtering chamber 20 to correct any detected gas leaks, and then repeating a time-consuming target "clean-up" procedure in preparation for a sputtering operation, with a loss in production time and target material, has been eliminated. The need for pre-drilling gas-carrying apertures in the target 24, and for mounting gas diffusers in the apertures, also has been eliminated. In addition, more efficient cooling of the target 24 is achieved as a result of the dual construction of the target cooling cell assembly 26, in which each of the C-shaped cooling cells 92 is formed with an undersize radius with respect to the target, whereby the cooling cells are capable of being more readily expanded radially into tight mating engagement with the target. More efficient cooling of the target 24 also is achieved as a result of the cooling cells 92 having greater internal cooling water carrying capacity, and each cooling cell having its own independent cooling water input-and-return line system 95. As a result, the sputtering rate of the target 24 and the production output of the sputtering chamber 20 can be significantly increased.

What is claimed is:

1. A method of sputtering material onto a substrate in a sputtering chamber, which comprises the steps of:

disposing a target of the sputtering material in the sputtering chamber such that a first surface of the target faces a first portion of the sputtering chamber and a second opposite surface of the target faces a second portion of the sputtering chamber;

disposing the substrate in the second portion of the sputtering chamber in opposed relationship to the second surface of the target to define a sputtering area within the second portion of the sputtering chamber between the substrate and the second surface of the target;

sputtering material from the second surface of the target across the sputtering area in the second portion of the sputtering chamber in a sputtering operation such that the material is deposited on the substrate;

introducing a gaseous doping agent into the first portion of the sputtering chamber at a point which is in opposed relationship to the first surface of the target during the sputtering operation; and diffusing the gaseous doping agent from the point in the first portion of the sputtering chamber around opposite edges of the target and homogeneously into the sputtering area in the second portion of the sputtering chamber between the substrate and the second surface of the target during the sputtering operation, while precluding flow of the gaseous doping agent through the target into the sputtering area, such that the gaseous doping agent becomes incorporated into the sputtered material on the substrate in an essentially uniform manner to form a uniformly doped film on the substrate.

2. The method as recited in claim 1, which further comprises: cooling the target by engaging the first surface of the target with a cooling medium during the sputtering operation.

3. The method as recited in claim 1, in which:

the target is disposed in the sputtering chamber with the first and second surfaces of the target extending vertically; and the gaseous doping agent is diffused from the first portion of the sputtering chamber around upper and lower edges of the target into the sputtering area in the second portion of the sputtering chamber between the substrate and the second surface of the target.

4. The method as recited in claim 1, in which the sputtering chamber is of cylindrical construction and in which:

the first portion of the sputtering chamber is an inner portion of the sputtering chamber; and the point at which the gaseous doping agent is introduced into the first portion of the sputtering chamber is adjacent the geometric center of the cylindrical sputtering chamber.

5. The method as recited in claim 4, in which: the gaseous doping agent is introduced into the first portion of the cylindrical sputtering chamber in a direction extending essentially along a central axis of the cylindrical sputtering chamber.

6. The method as recited in claim 5, in which the target also is of cylindrical construction, in which the target and an outer wall of the cylindrical sputtering chamber define an annular sputtering area extending about the periphery of the sputtering chamber, and in which:

the gaseous doping agent also is introduced into the cylindrical sputtering chamber adjacent the geometric center of the target; and the gaseous doping agent is diffused from the first portion of the cylindrical sputtering chamber about upper and lower edges of the cylindrical target into the annular sputtering area during the sputtering operation.

7. The method as recited in claim 6, which further comprises:

forming a pair of C-shaped cooling cells with a radius less than a radius of the cylindrical target;

engaging a midportion of each of the C-shaped cooling cells with an interior surface of the target;

expanding each of the C-shaped cooling cells between the midportion of the cooling cell and opposite ends of the cooling cell radially outward into firm mating engagement with the interior surface of the target; and retaining the C-shaped cooling cells in firm engagement with the interior surface of the target during the sputtering operation.

8. The method as recited in claim 7, which further comprises: introducing a cooling medium into each of the C-shaped cooling cells independently of the other cooling cell.

9. Apparatus for sputtering material onto a substrate, which comprises:

a sputtering chamber;

means for supporting a target of the sputtering material in the sputtering chamber with a first surface of the target facing a first portion of the sputtering chamber and a second opposite surface of the target facing a second portion of the sputtering chamber;

means for supporting the substrate in the second portion of the sputtering chamber in opposed spaced relationship to the second surface of the target to define a sputtering area between the substrate and the second surface of the target;

means for causing sputtering of material from the second surface of the target across the sputtering area in the second portion of the sputtering chamber in a sputtering operation such that the material is deposited on the substrate;

means for introducing a gaseous doping agent into the first portion of the sputtering chamber at a point in spaced opposed relationship to the first surface of the target during the sputtering operation; and means for defining a passageway through which the gaseous doping agent diffuses from the first portion of the sputtering chamber around opposite edges of the target and homogeneously into the sputtering area in the second portion of the sputtering chamber between the substrate and the second surface of the target during the sputtering operation, such that the gaseous doping agent becomes incorporated into the sputtered material on the substrate to form a uniformly doped film on the substrate.

10. Apparatus as recited in claim 9, which further comprises: means for cooling the target, the cooling means being disposed in the first portion of the sputtering chamber and engaging the first surface of the target during the sputtering operation.

11. Apparatus as recited in claim 9, in which:

the target supporting means supports the target in the sputtering chamber with the first and second surfaces of the target extending vertically; and means for defining passageways through which the gaseous doping agent diffuses from the first portion of the sputtering chamber around upper and lower edges of the target and homogeneously into the sputtering area in the second portion of the sputtering chamber between the substrate and the second surface of the target in a sputtering operation.

12. Apparatus as recited in claim 9, in which:

the sputtering chamber is of cylindrical construction; and the gaseous doping agent introducing means includes a conduit extending into the first portion of the sputtering chamber and having a discharge orifice adjacent the geometric center of the cylindrical sputtering chamber.

13. Apparatus as recited in claim 12, in which: the gaseous doping agent introducing conduit extends essentially along the central axis of the cylindrical sputtering chamber.

14. Apparatus as recited in claim 12, in which:

the target also is of cylindrical construction, with the target and an outer wall of the cylindrical sputtering chamber defining an essentially annular sputtering area extending about the periphery of the sputtering chamber when the target is mounted on the target support means;

the discharge orifice of the gaseous doping agent introducing conduit also is adjacent the geometric center of the cylindrical target when the target is mounted on the target support means; and means are provided for defining upper and lower passageways through which the gaseous doping agent diffuses from the first portion of the cylindrical sputtering chamber about upper and lower edges of the cylindrical target and homogeneously into the annular sputtering area during the sputtering operation.

15. Apparatus as recited in claim 14, which further comprises:

a pair of C-shaped cooling cells in mating engagement with an interior surface of the target, the C-shaped cells having opposed spaced edges; and wedging means between the opposed spaced edges of the cooling cells for retaining the cells in mating engagement with the interior surface of the target.

16. Apparatus as recited in claim 15, which further comprises: separate means for introducing a cooling medium into the C-shaped cooling cells independently of one another.

* * * * *